(12) United States Patent
    Ai

(10) Patent No.: US 11,506,975 B2
(45) Date of Patent: Nov. 22, 2022

(54) PHOTORESIST MATERIAL, METHOD OF FABCRICATING SAME, AND COLOR FILTER SUBSTRATE

(71) Applicant: TCL CHINA STAR OPTOELECTRONICS TECHNOLOGY CO., LTD., Shenzhen (CN)

(72) Inventor: Lin Ai, Shenzhen (CN)

(73) Assignee: TCL China Star Optoelectronics Technology Co., Ltd., Guangdong (CN)

( * ) Notice: Subject to any disclaimer, the term of this patent is extended or adjusted under 35 U.S.C. 154(b) by 293 days.

(21) Appl. No.: 16/652,036

(22) PCT Filed: Jan. 10, 2020

(86) PCT No.: PCT/CN2020/071478
§ 371 (c)(1),
(2) Date: Mar. 28, 2020

(87) PCT Pub. No.: WO2021/128503
PCT Pub. Date: Jul. 1, 2021

(65) Prior Publication Data
US 2021/0216011 A1    Jul. 15, 2021

(30) Foreign Application Priority Data
Dec. 26, 2019  (CN) .......................... 201911363495.3

(51) Int. Cl.
*G03F 7/004*    (2006.01)
*G03F 7/00*     (2006.01)

(52) U.S. Cl.
CPC .......... *G03F 7/0042* (2013.01); *G03F 7/0007* (2013.01)

(58) Field of Classification Search
CPC .............................. G03F 7/0042; G03F 7/0007
See application file for complete search history.

(56) References Cited

FOREIGN PATENT DOCUMENTS

| CN | 105418643 A | * | 3/2016 |  |
| WO | WO-0043375 A2 | * | 7/2000 | ............. A01N 37/46 |

OTHER PUBLICATIONS

English machine translation of WO-0043375-A2 (Jul. 2000) (Year: 2000).*

(Continued)

*Primary Examiner* — Peter L Vajda
*Assistant Examiner* — Jayson D Cosgrove
(74) *Attorney, Agent, or Firm* — PV IP PC; Wei Te Chung; Ude Lu

(57) ABSTRACT

A photoresist material, a method of fabricating the same, and a color filter substrate are described. The photoresist material has an oligomer segment having a chemical structural formula of:

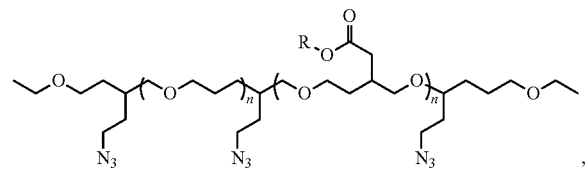

wherein a value of n is 1 to 2.

9 Claims, 2 Drawing Sheets

(56) References Cited

OTHER PUBLICATIONS

Batool, Tannaza, et al. "A convenient method for the synthesis of (Prop-2-Ynyloxy) benzene derivatives via reaction with propargyl bromide, their optimization, scope and biological evaluation." PLoS One 9.12 (2014): e115457. (Year: 2014).*

English machine translation of CN-105418643-A (Mar. 2016) (Year: 2016).*

\* cited by examiner

PHOTORESIST MATERIAL, METHOD OF FABCRICATING SAME, AND COLOR FILTER SUBSTRATE

FIELD OF DISCLOSURE

The present application relates to photoresists, and more particularly to a photoresist material, method of fabricating the same, and a color filter substrate.

BACKGROUND OF DISCLOSURE

Liquid crystal displays rely on color-resist materials to re-display colors. Color-resist materials in a display field are made of different color-developing pigments. Since the pigment has poor solubility in the industrial solvent of propylene glycol methyl ether acetate (PGMEA), it is usually stably dispersed in the solvent during a fabricating process. Previous pigment particle dispersion methods involved too many steps, such as control of molecular crystallinity, physical grinding and size control of pigment particles, and stabilization of particles. Each step will affect a penetration of the color resist film layer, which increases uncontrollable factors. Further, crystal particles prepared by physical grinding are about 50 nanometers. Due to the large particle size, they often cause obvious scattering effects on the light path and cause light loss.

SUMMARY OF DISCLOSURE

An embodiment of the present application provides a photoresist material comprising an oligomer segment having a chemical structural formula of:

The present disclosure further provides a method of fabricating a photoresist material, comprising: dissolving and stirring compound 1 in tetrahydrofuran to form a first solution, adding sodium hydride to the first solution to form a second solution, and adding compound 2 to the second solution to stir at 60° C. for 6 hours so as to obtain compound 3 after purifying and isolating; wherein a chemical structure of the compound 1 is:

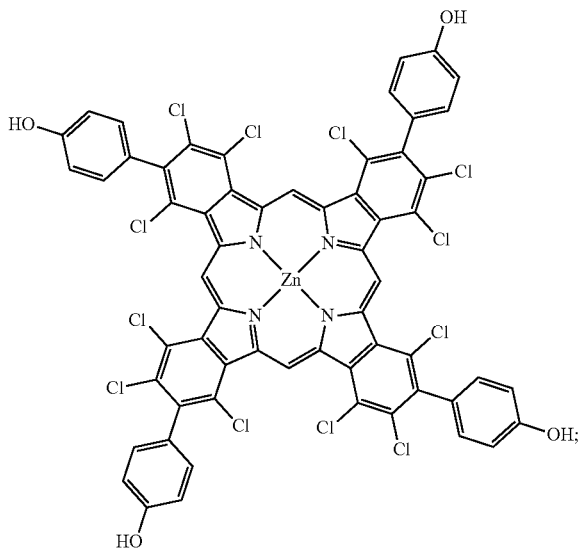

wherein a chemical structure of the compound 2 is:

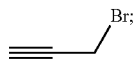

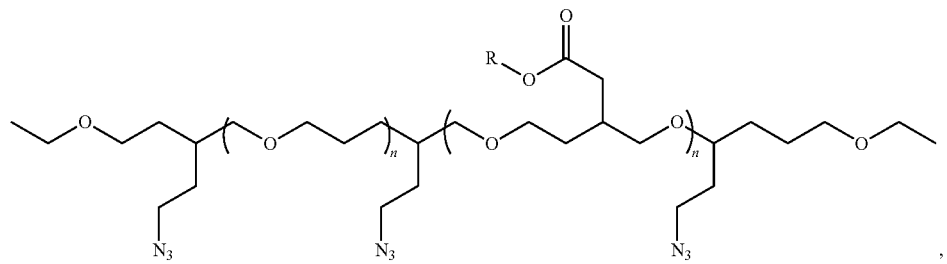

wherein a value of n is 1 to 2.

and
wherein a chemical structure of the compound 3 is:

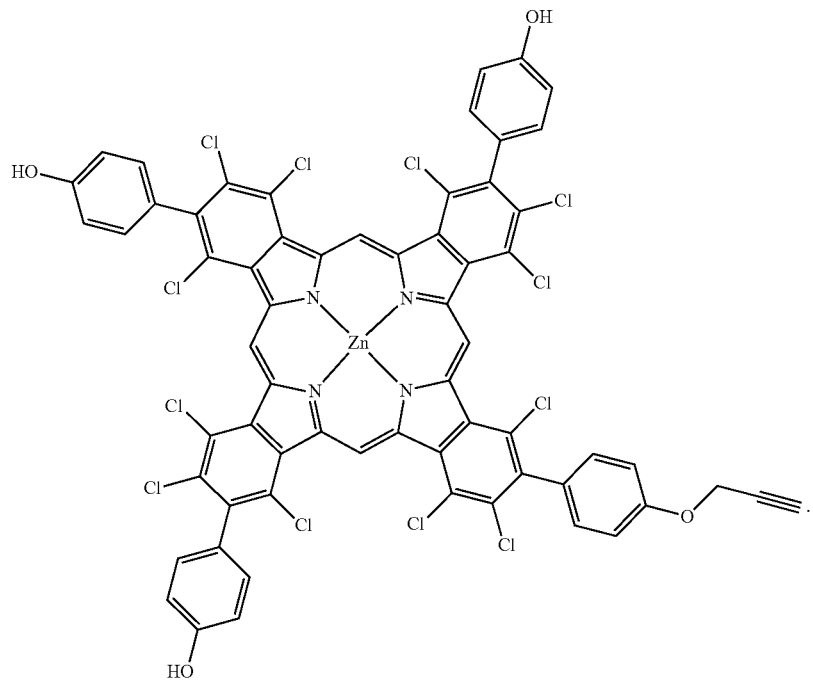

Further, a molar ratio of the compound 1 to the sodium hydride is 4:1; and a molar ratio of the compound 1 to the compound 2 is 4:1.5.

Further, the method further comprises: dissolving the compound 3 and the oligomer segment in toluene to form a first solution, and adding a catalyst to the first solution to obtain the photoresist material through a purification treatment after a reaction at room temperature for 30 minutes, wherein a chemical structure of the photoresist material is:

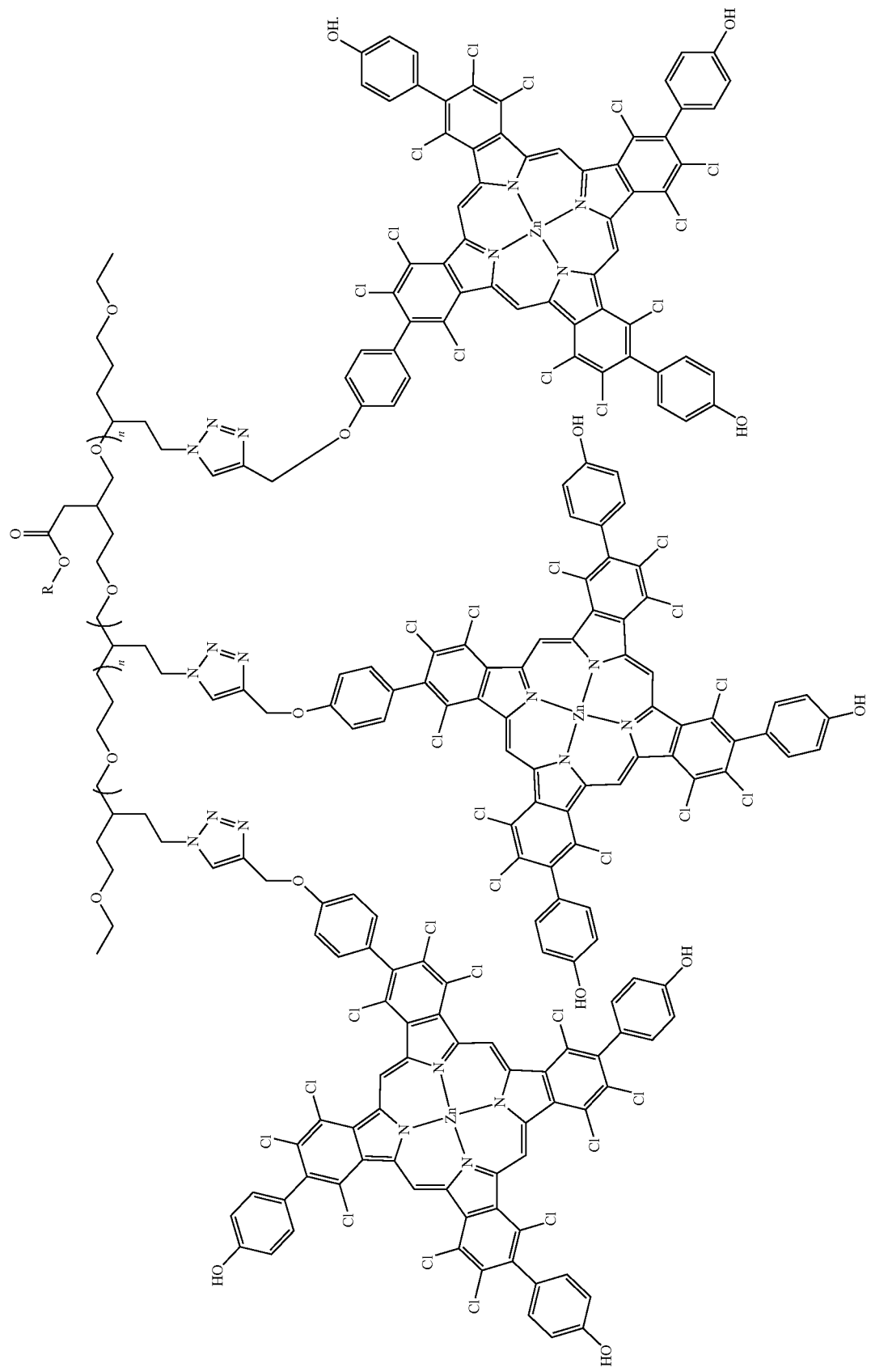

Further, a molar ratio of the compound 3 to the oligomer segment is 1:1.

Further, R in the oligomer segment comprises: at least one of non-conjugated linear alkanes, branched alkanes, alkoxy alkane, halogen-substituted alkane derivatives, conjugate structures linked through alkoxy and ester groups, or compounds containing heterocycles; wherein the heterocyclic compound includes at least one of a five-membered heterocyclic ring compound, a six-membered heterocyclic ring compound, or a benzoheterocyclic compound; wherein the five-membered heterocyclic compound comprises at least one of furan, thiophene, pyrrole, thiazole, and imidazole; and wherein the six-membered heterocyclic compound comprises at least one of pyridine, pyrazine, pyrimidine, and pyridazine.

Further, carbon chain length in R structure is 1 to 3.

Further, the catalyst is pentamethylcyclopentadienyl ruthenium chloride.

Further, a chemical structure of the compound 3 further comprises: at least one of

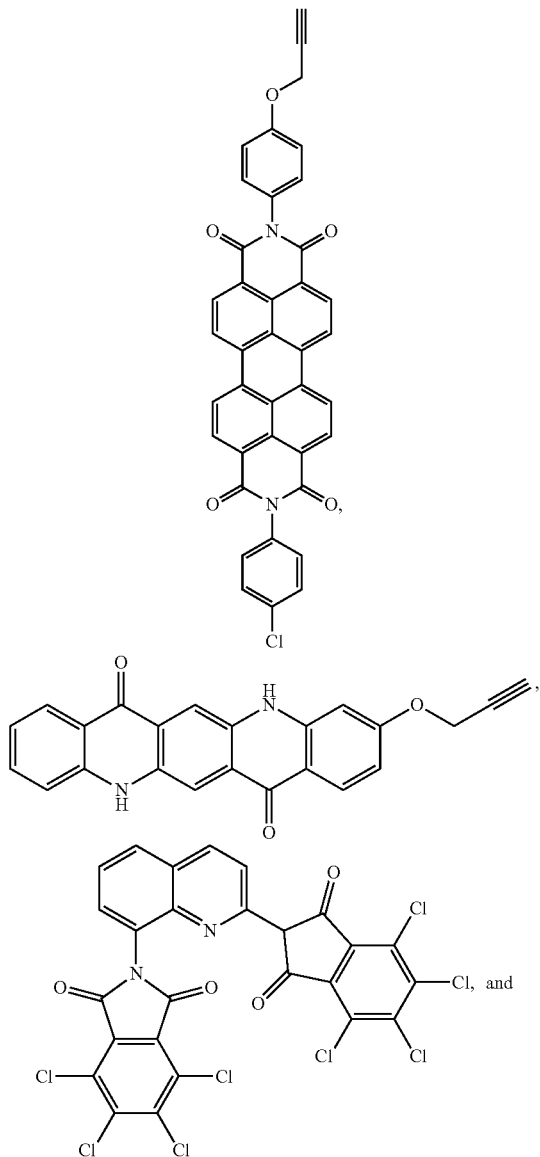

-continued

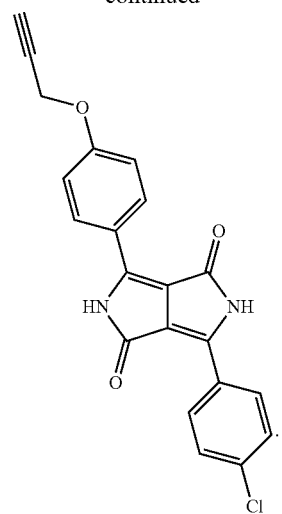

The present disclosure further provides a color filter substrate comprising a color resist layer, wherein material of the color resist layer comprises the photoresist material.

Beneficial effects are that: in a photoresist material and a method of fabricating the same of the present disclosure, an ink connects a dye with an oligomer segment to form a heat-resistant photoresist material. Simultaneously, molecules of the dye can be dispersed through an interval of the oligomer segments to improve solubility of the photoresist material and achieve the effect of further solubilization. A color filter having high contrast and high transmittance can be fabricated by the ink with a photoresist material as a raw material.

DESCRIPTION OF DRAWINGS

Following detailed description of specific embodiments of the present application will make the technical solutions and other beneficial effects of the present application obvious in conjunction with the accompanying drawings.

DETAILED DESCRIPTION OF PREFERRED EMBODIMENTS

Embodiments

Figure 1:
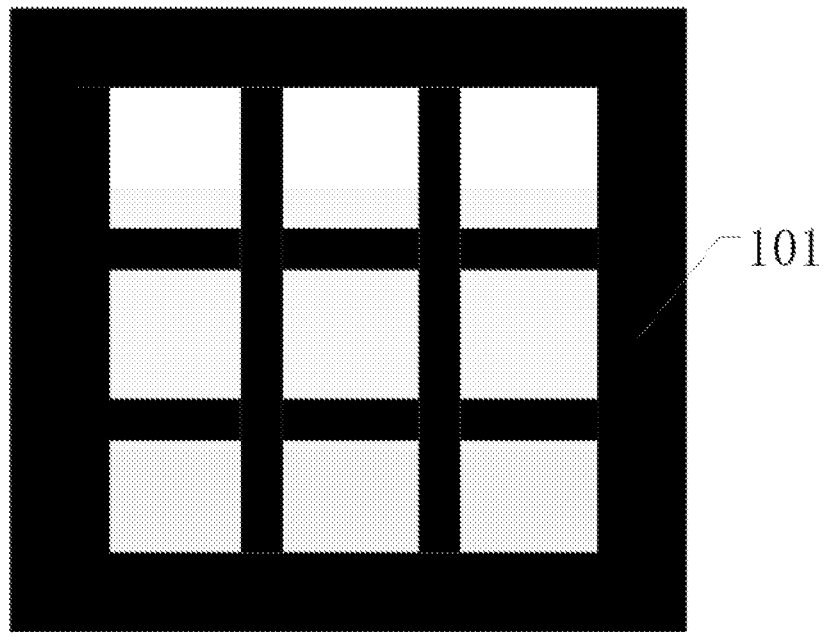
FIG. 1 is a diagram of steps for fabricating a light-shielding layer in an embodiment.

In the present embodiment, a photoresist material of the present disclosure connects an existing color resist material with an oligomer segment through a click chemical reaction to form the photoresist material.

A chemical structural formula of the oligomer segment is:

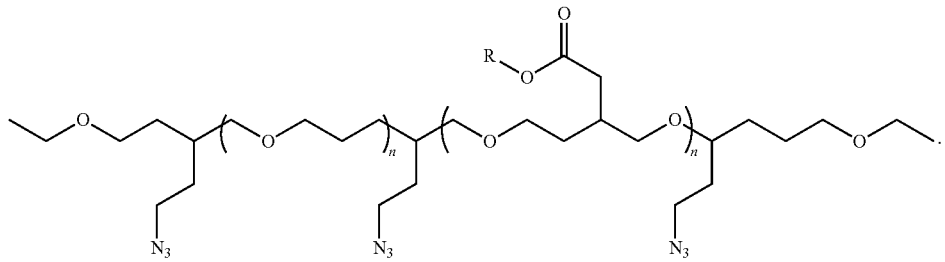

A value of n is 1 to 2.

R in the oligomer segment comprises: at least one of non-conjugated linear alkanes, branched alkanes, alkoxy alkane, halogen-substituted alkane derivatives, conjugate structures linked through alkoxy and ester groups, or compounds containing heterocycles; wherein the heterocyclic compound includes at least one of a five-membered heterocyclic ring compound, a six-membered heterocyclic ring compound, or a benzoheterocyclic compound.

The five-membered heterocyclic compound comprises at least one of furan, thiophene, pyrrole, thiazole, and imidazole.

The six-membered heterocyclic compound comprises at least one of pyridine, pyrazine, pyrimidine, and pyridazine.

In the present embodiment, a phthalocyanine molecule is connected to the oligomer segment to form a photoresist material, and a chemical structure formula of the photoresist material is:

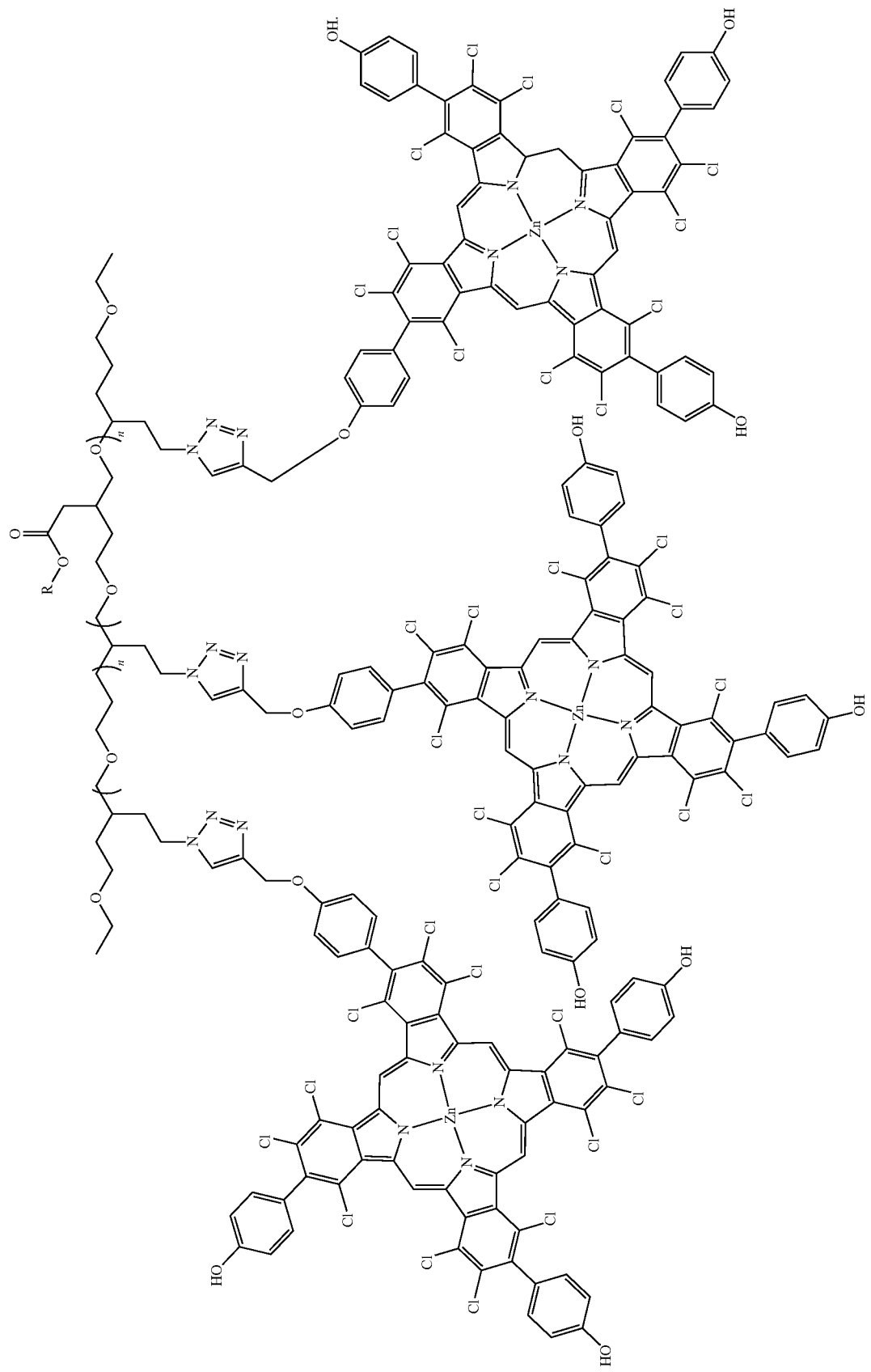

Specific steps of fabricating the photoresist material include:

dissolving and stirring compound 1 in tetrahydrofuran to form a first solution, adding sodium hydride to the first solution to form a second solution, and adding compound 2 to the second solution to stir at 60° C. for 6 hours so as to obtain compound 3 after purifying and isolating;

dissolving the compound 3 and the oligomer segment in toluene to form a first solution, and adding pentamethylcyclopentadienyl ruthenium chloride as a catalyst to the first solution to obtain the photoresist material through a purification treatment after a reaction at room temperature for 30 minutes;

wherein a molar ratio of the compound 1 to the sodium hydride is 4:1; and a molar ratio of the compound 1 to the compound 2 is 4:1.5.

A chemical structure of the compound 1 is:

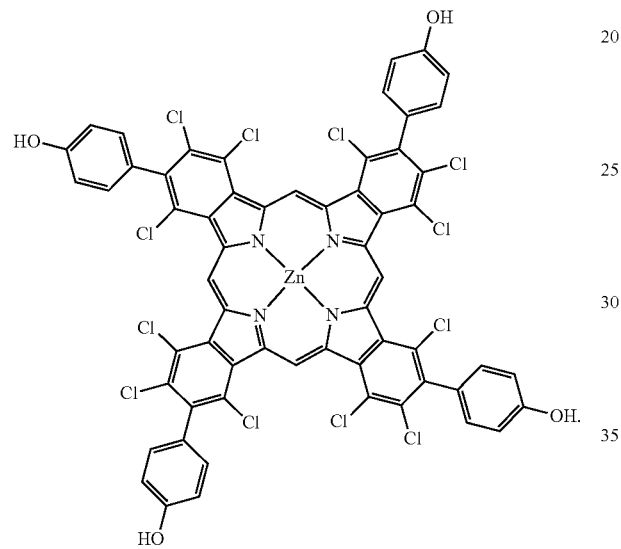

A chemical structure of the compound 2 is:

A chemical structure of the compound 3 is:

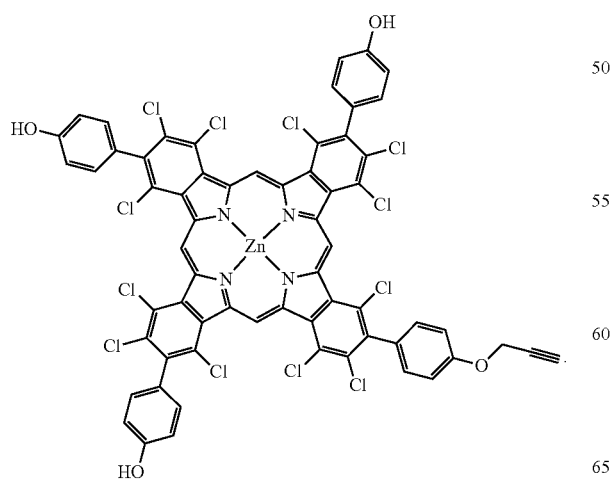

A reaction synthesis roadmap is:
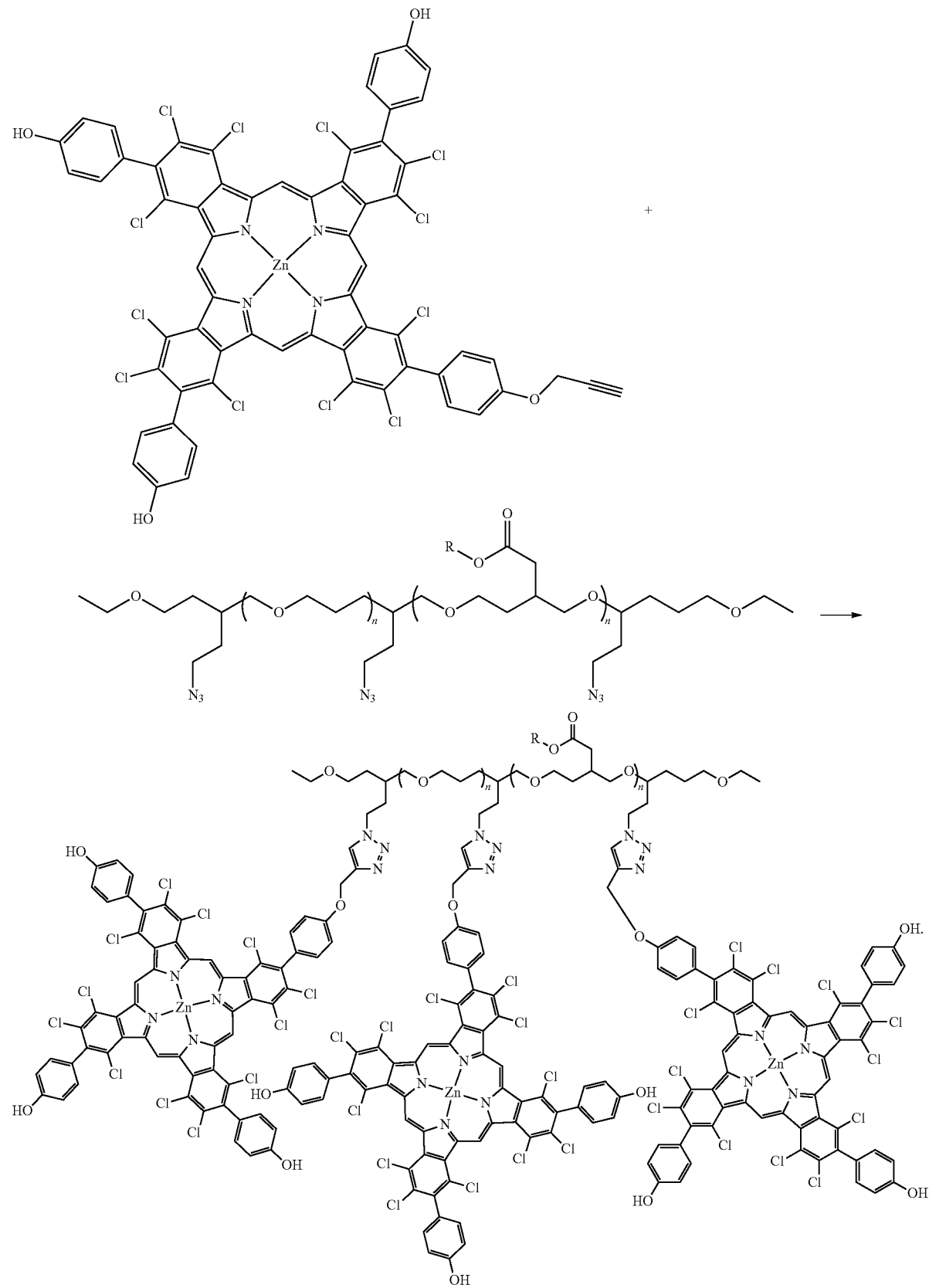

In other preferred embodiments of the present disclosure, the oligomer segment in the photoresist material may be connected with other materials of different colors, that is, A chemical structural formula of the compound 3 further includes:

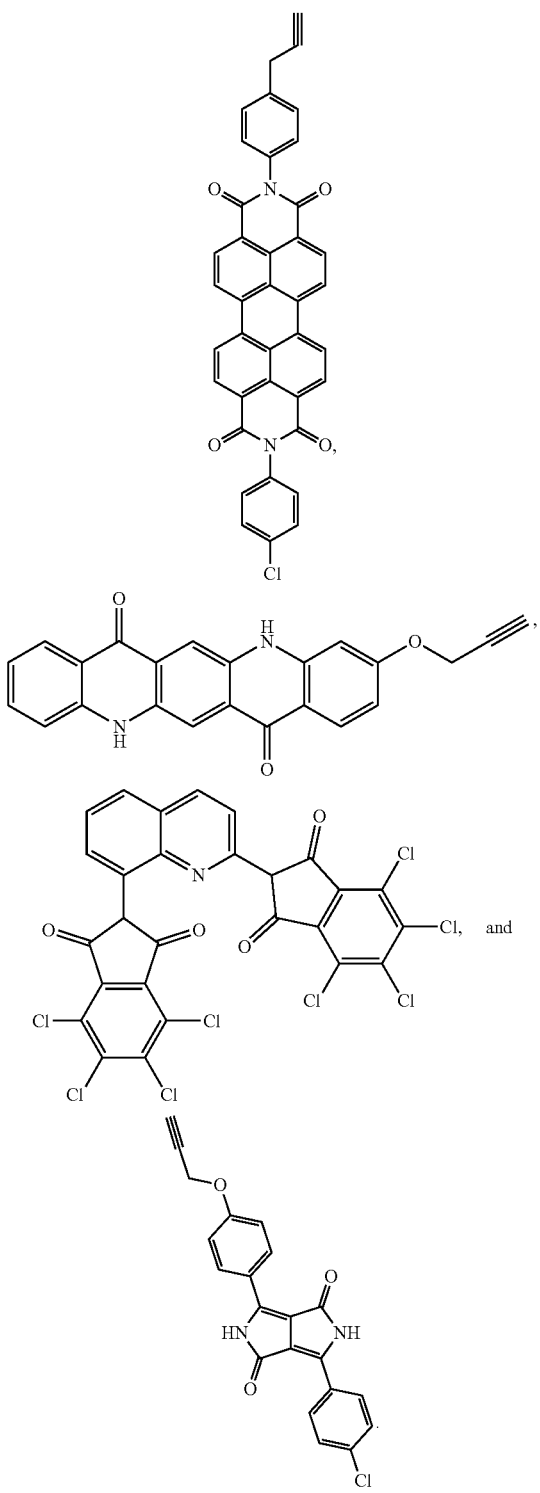

In order to better explain the present disclosure, a color filter substrate 1 is also provided in this embodiment, which includes a color resist layer 10 distributed on the color filter substrate 1 to achieve color display of the color filter substrate 1.

Figure 3:
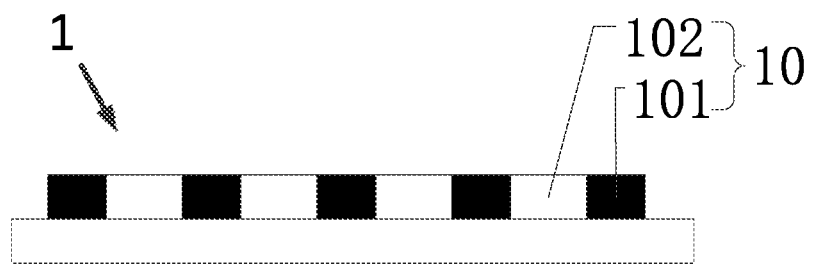
FIG. 3 is a schematic view of a color filter substrate in an embodiment.

Material of the color resist layer 10 includes the photoresist material, and a specific fabricating method thereof is as follows:

As shown in FIG. 3, the photoresist material is dissolved in an organic solvent to prepare an ink, and the color resist layer 10 is fabricated by an inkjet printing method, wherein the organic solvent includes at least one of an alkane, a saturated cycloalkane, a bicycloalkane, a polycycloalkane, an ether, a single or a plurality of benzenecycloalkanes.

A mass range of the organic solvent in the ink is 40 wt % to 99.9 wt %. A mass range of the photoresist material in the ink is 0.1 wt % to 60 wt %.

Specific Steps Include:

As shown in FIG. 1, a light-shielding layer 101 is fabricated on a glass substrate, and several light-transmitting holes are formed in the light-shielding layer 101.

Figure 2:
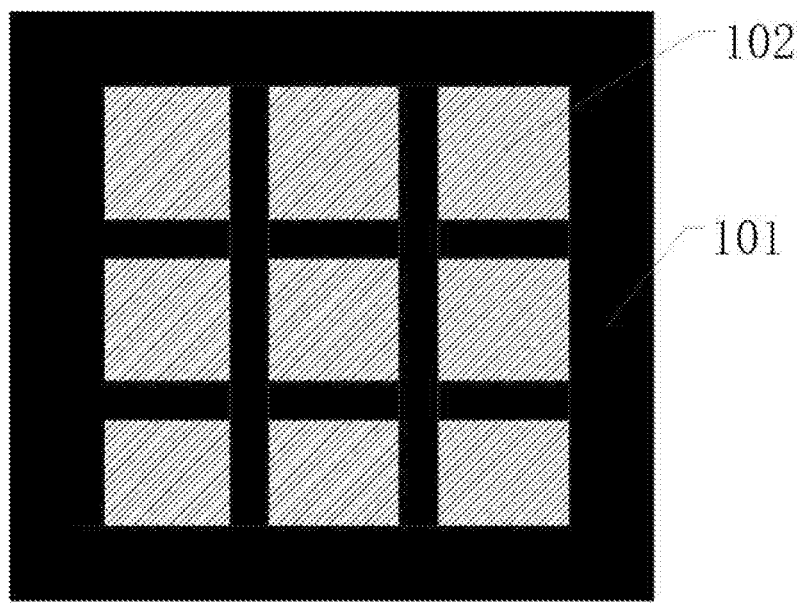
FIG. 2 is a drawing of steps for fabricating a color resist layer in an embodiment.

As shown in FIG. 2, color resist units 102 are fabricated by inkjet printing technology in the light transmission holes. The color resist units include a red color resist unit, a green color resist unit, and a blue color resist unit. The color resist units in two adjacent light transmitting holes have different colors.

The descriptions of the above embodiments are only used to assist in understanding the technical solutions and core ideas of this application. Those of ordinary skilled in the art should understand that they can still modify the technical solutions described in the foregoing embodiments, or equivalently replace some of the technical features. These modifications or replacements do not make the essence of the corresponding technical solutions outside the scope of the technical solutions of the embodiments of the present application.

The invention claimed is:

1. A photoresist material, comprising an oligomer segment having a chemical structural formula of:

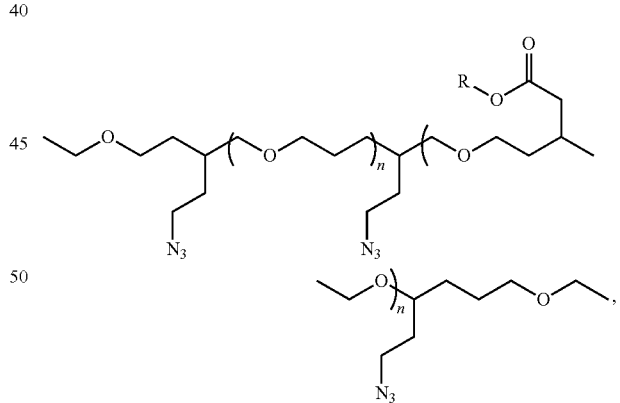

wherein a value of n is 1 to 2;

wherein, R comprises: at least one of non-conjugated linear alkanes, branched alkanes, alkoxy alkane, halogen-substituted alkane derivatives, conjugate structures linked through alkoxy and ester groups, or compounds containing heterocycles.

2. A method of fabricating a photoresist material, comprising:

dissolving and stirring compound 1 in tetrahydrofuran to form a first solution, adding sodium hydride to the first solution to form a second solution, and adding compound 2 to the second solution to stir at 60° C. for 6 hours so as to obtain compound 3 after purifying and isolating;

wherein a chemical structure of the compound 1 is:

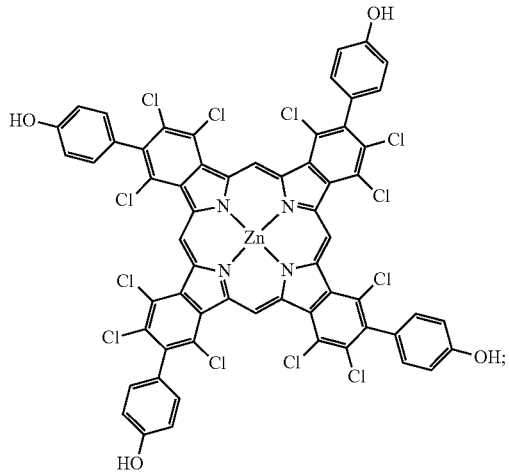

wherein a chemical structure of the compound 2 is:

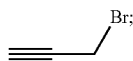

and wherein a chemical structure of the compound 3 is:

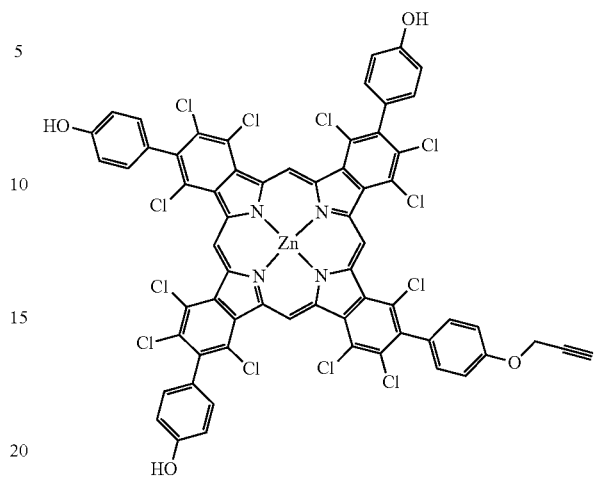

3. The method of fabricating the photoresist material according to claim 2, wherein a molar ratio of the compound 1 to the sodium hydride is 4:1; and
a molar ratio of the compound 1 to the compound 2 is 4:1.5.

4. The method of fabricating the photoresist material according claim 2, further comprising:
dissolving the compound 3 and an oligomer segment in toluene to form a first solution, and adding a catalyst to the first solution to obtain the photoresist material through a purification treatment after a reaction at room temperature for 30 minutes,
wherein the oligomer segment having a chemical structural formula of:

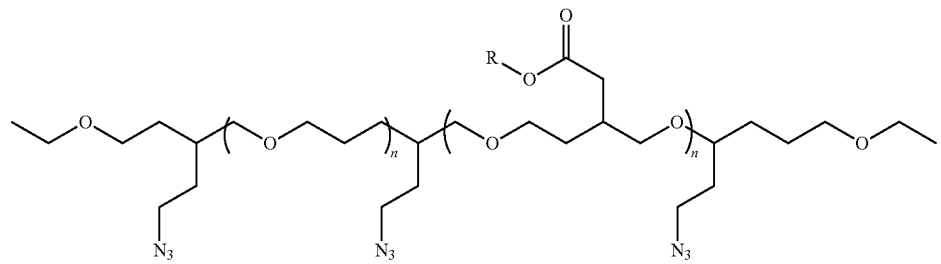

wherein a value of n is 1 or 2;
wherein, R comprises: at least one of non-conjugated linear alkanes, branched alkanes, alkoxy alkane, halogen-substituted alkane derivatives, conjugate structures linked through alkoxy and ester groups, or compounds containing heterocycles,
wherein a chemical structure of the photoresist material is:

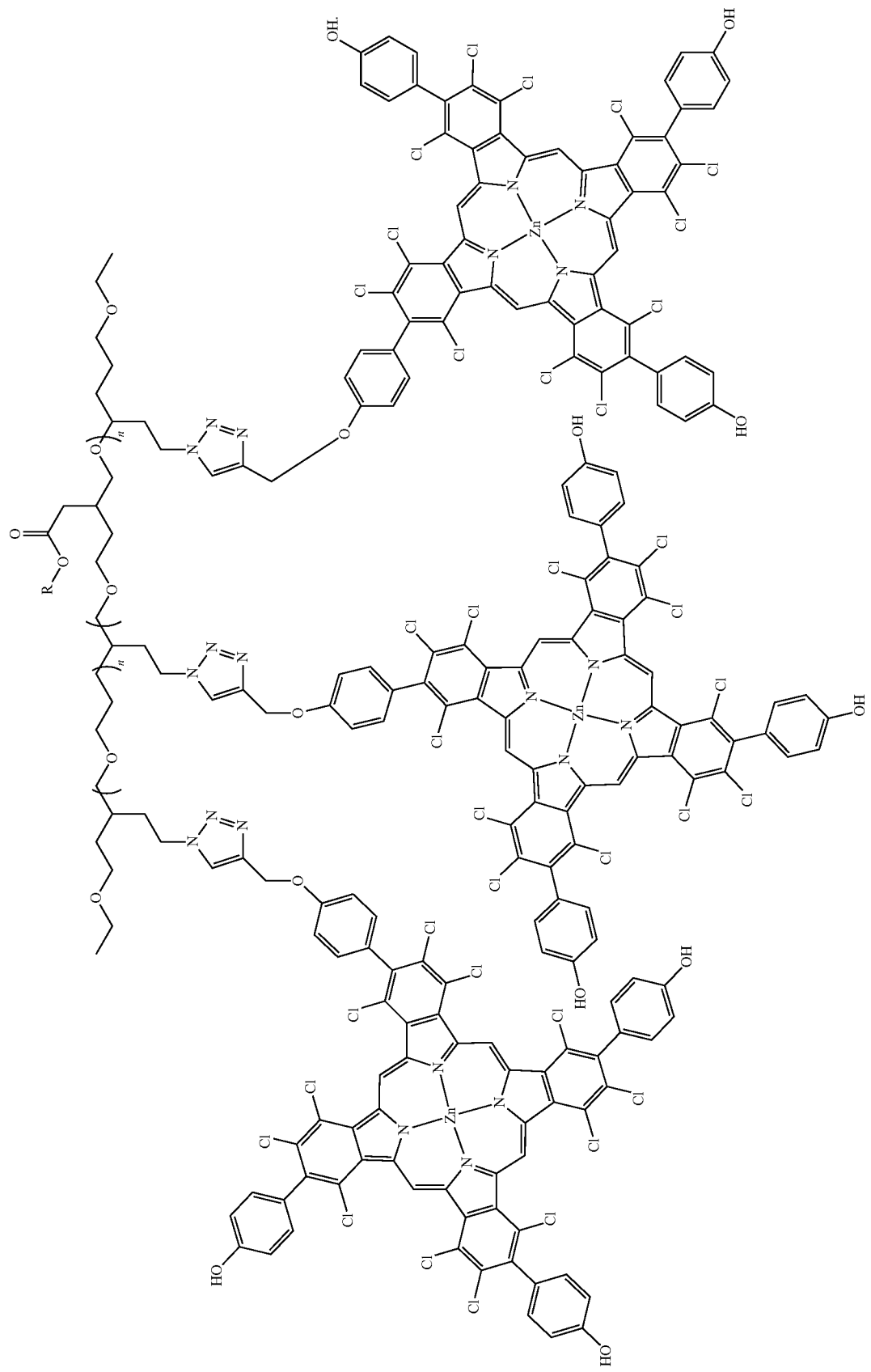

5. The method of fabricating the photoresist material according to claim 4, wherein:
   a molar ratio of the compound 3 to the oligomer segment is 1:1.

6. The method of fabricating the photoresist material according to claim 4, wherein R in the oligomer segment comprises:
   at least one of non-conjugated linear alkanes, branched alkanes, alkoxy alkane, halogen-substituted alkane derivatives, conjugate structures linked through alkoxy and ester groups, or compounds containing heterocycles; wherein the heterocyclic compound includes at least one of a five-membered heterocyclic ring compound, a six-membered heterocyclic ring compound, or a benzoheterocyclic compound;
   wherein the five-membered heterocyclic compound comprises at least one of furan, thiophene, pyrrole, thiazole, and imidazole; and
   wherein the six-membered heterocyclic compound comprises at least one of pyridine, pyrazine, pyrimidine, and pyridazine.

7. The method of fabricating the photoresist material according to claim 6, wherein carbon chain length in R is 1 to 3.

8. The method of fabricating the photoresist material according to claim 4, wherein the catalyst is pentamethylcyclopentadienyl ruthenium chloride.

9. A color filter substrate, comprising a color resist layer, wherein material of the color resist layer comprises the photoresist material according to claim 1.

* * * * *